United States Patent
Kuhwald et al.

(10) Patent No.: US 8,487,607 B2
(45) Date of Patent: Jul. 16, 2013

(54) METHOD AND DEVICE FOR DIGITAL TRIGGERING OF A MEASUREMENT SIGNAL HAVING A SUPERIMPOSED NOISE SIGNAL

(75) Inventors: Thomas Kuhwald, Markt Schwaben (DE); Johann Huber, Markt Schwaben (DE); Markus Freidhof, Kirchseeon (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 561 days.

(21) Appl. No.: 12/299,751

(22) PCT Filed: Apr. 19, 2007

(86) PCT No.: PCT/EP2007/003453
§ 371 (c)(1),
(2), (4) Date: Oct. 15, 2009

(87) PCT Pub. No.: WO2007/128392
PCT Pub. Date: Nov. 15, 2007

(65) Prior Publication Data
US 2010/0045260 A1    Feb. 25, 2010

(30) Foreign Application Priority Data
May 5, 2006  (DE) .................. 10 2006 021 075

(51) Int. Cl.
*G01R 23/16* (2006.01)
(52) U.S. Cl.
USPC ................. 324/76.12; 324/76.82; 324/76.44
(58) Field of Classification Search
USPC ..................................... 324/76.12
See application file for complete search history.

(56) References Cited

U.S. PATENT DOCUMENTS

| | | | |
|---|---|---|---|
| 3,704,416 A | 11/1972 | Elliott et al. | |
| 4,209,843 A * | 6/1980 | Hyatt | 708/422 |
| 4,553,221 A * | 11/1985 | Hyatt | 708/308 |
| 5,053,983 A * | 10/1991 | Hyatt | 708/306 |
| 5,272,439 A | 12/1993 | Mashikian et al. | |
| 2003/0128021 A1 | 7/2003 | Tan et al. | |
| 2006/0074607 A1 | 4/2006 | Weller | |

FOREIGN PATENT DOCUMENTS

| | | |
|---|---|---|
| DE | 3418500 A1 | 11/1985 |
| DE | 693 33 936 T2 | 6/2006 |
| JP | 07 234250 A | 9/1995 |
| JP | 7234250 A | 9/1995 |
| WO | WO 2007/128392 A3 | 11/2007 |

OTHER PUBLICATIONS

JP 07-234250A—1995, JPO Machine Translation, including drawings, p. 1-5.*

(Continued)

*Primary Examiner* — Thomas Valone
(74) *Attorney, Agent, or Firm* — Ditthavong, Mori & Steiner, P.C.

(57) ABSTRACT

A method for digital triggering of a digital recording of a digitized measurement signal having a superimposed noise signal. The method includes generating from the digitized measurement signal a digital triggering signal for the digital triggering of the digital recording of the measurement signal, and performing band-limitation of the noise signal superimposed on the digitized measurement signal via a low-pass filtering before the digital triggering signal is generated. The bandwidth of the low-pass filtering is adjusted dependent upon edge steepness of the measurement signal, in order to reduce variance $\sigma_t^2$ in jitter of the digital triggering signal.

2 Claims, 3 Drawing Sheets

OTHER PUBLICATIONS

Lehmann, DE 3418500A1, PTO Translation (PTO 11-6240), without drawings, p. 1-20.*

Anonymous, Application Note: HFAN-3.3.0, Jitter Specifications Made Easy, website, Feb. 6, 2001, pp. 1-6, XP-002461833, URL: http://pdfserv.maxim-ic.com/en/an/AN377.pdf.

Roger L. Jungerman and Parmijit Samra, Switched-radar scenario generation with Femtosecond jitter, website, Aug. 1, 2005, pp. 18-22, XP-002461834, URL: http://rfdesign.com/mag/508RFDSF2.pdf.

Eric Desrochers, Lowpass filter discriminates step input from noise, website, Sep. 18, 2003, pp. 92 and 96, URL: http://www.edn.com/contents/images/91803di.pdf.

"Switched-radar scenario generation with Femtosecond jitter," DefenseElectronics, Aug. 2005, pp. 1-5.

"Jitter Specifications Made Easy: A Heuristic Discussion of Fibre Channel and Gigabit Ethernet Methods," Maxim Integrated Projects, Feb. 6, 2001, pp. 1-6.

Eric Desrochers, "Lowpass filter discriminates step input from noise," Internet webpage (http://www.edn.com/index.asp?layout=articlePrint&articleID=CA321803), Sep. 18, 2003, pp. 1-2.

International Search Report, PCT/EP2007/003453, Jan. 22, 2009, pp. 1-13.

* cited by examiner

| Frequency of the signal in MHz | SNR in dB | | | |
|---|---|---|---|---|
| | 30 | 40 | 50 | 60 |
| 1 | 5032.92 ps | 1591.55 ps | 503.29 ps | 159.15 ps |
| 10 | 503.29 ps | 159.15 ps | 50.33 ps | 15.92 ps |
| 100 | 50.33 ps | 15.92 ps | 5.03 ps | 1.59 ps |
| 1000 | 5.03 ps | 1.59 ps | 0.50 ps | 0.16 ps |

| | Frequency of the sinusoidal signal | | | |
|---|---|---|---|---|
| | 1 MHz | 10 MHz | 100 MHz | 1 GHz |
| Triggering errors | 5.03 ns | 503 ps | 50.3 ps | 5.03 ps |

| | Frequency of the sinusoidal signal | | | |
|---|---|---|---|---|
| | 1 MHz | 10 MHz | 100 MHz | 1 GHz |
| Triggering errors | 159.1 ps | 50.3 ps | 15.9 ps | 5.03 ps |

METHOD AND DEVICE FOR DIGITAL TRIGGERING OF A MEASUREMENT SIGNAL HAVING A SUPERIMPOSED NOISE SIGNAL

CROSS-REFERENCE TO RELATED APPLICATION

The present application claims priority to PCT Application No. PCT/EP2007/003453, filed on Apr. 19, 2007, and to German Patent Application No. 10 2006 021 075.1, filed on May 5, 2006, the entire contents of which are herein incorporated by reference.

BACKGROUND OF THE INVENTION

1. Field of the Invention

The invention relates to a method and a device for digital triggering of a recording of a reference signal having a superimposed noise signal.

2. Discussion of the Background

A phase-corrected and time-corrected presentation of a measurement signal on a recording device, such as a digital oscilloscope, requires a triggering, which identifies the signal portion of the measurement signal to be presented on the recording device, for example, via a threshold triggering value, and initiates the recording of the measurement signal on the recording device at the triggering time via a triggering signal derived from the latter.

If a noise signal, which corresponds to a mean-free, white noise with the variance $\sigma_n^2$ is superimposed on the measurement signal, there is no fixed triggering time $t_{trigger}$ as in the case of a noise-free measurement signal, but rather, as shown in FIG. 1, a jitter of the triggering time $t_{trigger}$ with a variance $\sigma_t^2$ dependent upon the variance $\sigma_n^2$ of the noise signal.

Starting from FIG. 1 and the triggering equation (1) derived from it, with a triggering threshold value $u_r$ of ½ and an edge steepness m of the measurement signal, a fixed value corresponding to equation (2) is obtained for the triggering time $t_{trigger}$ of a noise-free measurement signal:

$$u_r = m \cdot t_{trigger} \quad (1)$$

$$t_{trigger} = \frac{1}{2 \cdot m} \quad (2)$$

If a noise signal n with the variance $\sigma_n^2$ is superimposed on the measurement signal, starting from the triggering equation (3) with a triggering threshold value $u_r$ of ½ and an edge steepness m of the measurement signal, a jittering triggering time $t_{trigger}$ is obtained according to equation (4) with a mean value of and a variance $$\frac{1}{2 \cdot m}$$

and a variance $\sigma_t^2$ according to equation (5).

$$u_r = m \cdot t_{trigger} + n \quad (3)$$

$$t_{trigger} = \frac{1}{2 \cdot m} - \frac{n}{2} \quad (4)$$

$$\sigma_t^2 = \frac{\sigma_n^2}{n^2} \quad (5)$$

It is evident from equation (5) that the variance $\sigma_t^2$ in the jitter of the triggering time for a measurement signal with a superimposed noise signal increases with an increasingly flatter leading edge m of the measurement signal. While the variance $\sigma_t^2$ in the jitter of the triggering time in the case of a high-frequency measurement signal with a high edge steepness m according to FIG. 2A is comparatively low, the variance $\sigma_t^2$ in the jitter of the triggering time in the case of a low-frequency measurement signal with a low edge steepness m according to FIG. 2B is significantly increased and is no longer negligible.

It is evident from Table 1 in FIG. 3, that with a decreasing frequency of the measurement signal and therefore a decreasing edge steepness m and at the same time a decreasing signal-noise ratio (SNR) and therefore an increasing noise-signal component in measurement signal, the variance $\sigma_t^2$ in the jitter of the triggering signal and therefore the inaccuracy of the triggering increases.

Document DE 34 18 500 A1 describes a device and a method, in which the disadvantage of jitter in the triggering time and the associated triggering inaccuracy resulting from a noise superimposed on the measurement signal is overcome by converting the level triggering into a time triggering proportional to the latter so that an appropriate threshold value for the time triggering can be set dependent upon the bandwidth of the measurement signal and the bandwidth of the noise signal.

The disadvantage of a realization of this kind is the comparatively high cost in circuit technology (detection of the zero crossing, generation of the sweep voltage, initialization of the sweep voltage and detection of the set-value pass).

SUMMARY OF THE INVENTION

The object of the present invention is therefore to develop a method and a device for a digital triggering, with which the triggering inaccuracy in the case of a measurement signal having a superimposed noise signal, especially a low-frequency measurement signal, is minimized at low-cost.

According to the invention, a low-pass filter, which reduces the bandwidth of the measurement signal having a superimposed noise signal, is connected upstream of the digital triggering. This reduces the variance $\sigma_n^2$ of the noise signal, which leads to a minimization of the triggering error.

BRIEF DESCRIPTION OF THE DRAWINGS

The method according to the invention and the device according to the invention for digital triggering of a recording of a measurement signal having a superimposed noise signal is described in detail below with reference to the drawings. The drawings are as follows.

DETAILED DESCRIPTION OF EXEMPLARY EMBODIMENTS OF THE INVENTION

Figure 1:
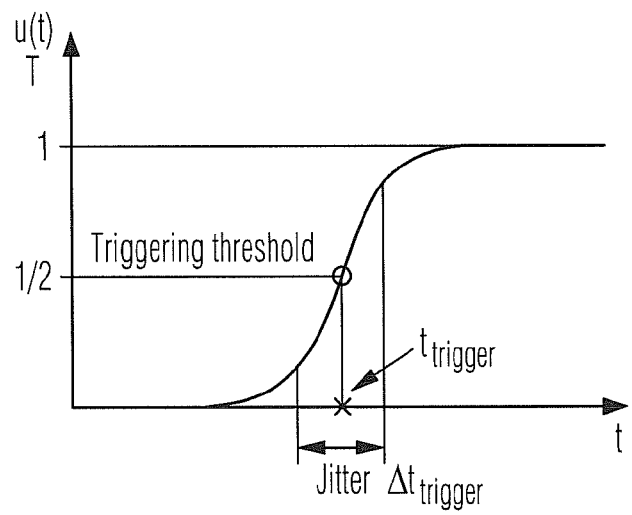
FIG. 1 shows a presentation against time of a triggering threshold of a measurement signal with superimposed noise signal.
Figure 2A:
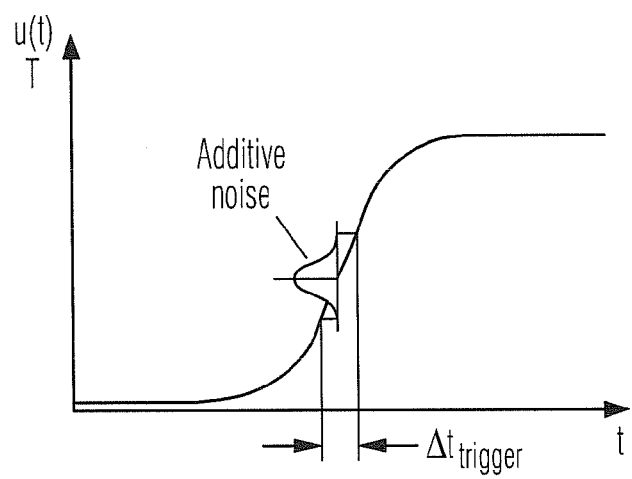
FIGS. 2A, 2B show a presentation against time of a triggering threshold of a high-frequency and low frequency measurement signal with superimposed noise signal.
Figure 2B:
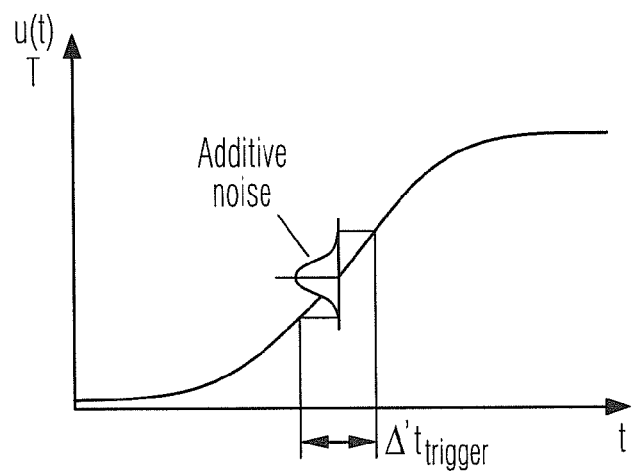

The device according to the invention for digital triggering is presented in FIG. 4 and described below.

The analog measurement signal with superimposed noise is converted in an analog/digital converter 1 into its corresponding digital data format. The digitized measurement signal distorted in a linear or respectively non-linear manner is equalized in a subsequent filter-type equalizer 2.

The signal at the output of the filter-type equalizer 2 is compressed in a decimation unit 3 by re-routing to the recording unit 4 only every n-$^{th}$ sampled value of the signal at the output of the filter-type equalizer 2. In parallel with this, the signal at the output of the filter-type equalizer 2 is supplied to a low-pass filter 5. In particular, the relatively high-frequency noise signal by comparison with the measurement signal is band-limited according to the invention in the low-pass filter 5. In this manner, the variance $\sigma_n^2$ of the noise signal is reduced. In a digital triggering unit 6 downstream of the low-pass filter 5, the band-limited measurement signal with superimposed noise signal is compared with adjustable threshold values in order to generate a triggering signal.

The digital triggering signal is supplied to a recording-control unit 7 within the recording unit 4. In the recording-control unit 7, the decimated sampled values of the measurement signal with superimposed noise signal buffered in a cyclical manner in a ring buffer 10, are selected for the recording with regard to the triggering signal. The sampled values of the measurement signal with superimposed noise signal selected by the recording-control unit 7 are stored in a subsequent acquisition memory 8 of the recording unit 4 and then presented on a visualization unit 9, for example, a display of the recording unit 4. Finally, in the concluding procedural stage S60, the recording of the compressed, equalized, digitized measurement signal with superimposed noise signal is implemented dependent upon the digital triggering signal. For this purpose, the measurement signal with superimposed noise signal, which is buffered, for example, in a ring buffer, is selected dependent upon the triggering signal with regard to its digitized signal components to be stored in a subsequent acquisition memory 8 and displayed on a subsequent visualization unit 9.

Figures 3, 4, 5A, 5B:
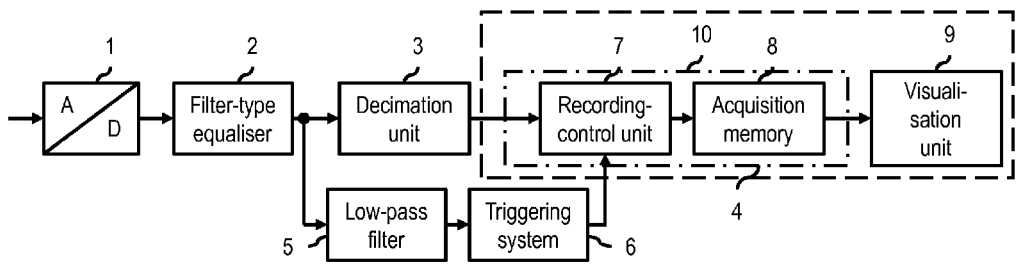
FIG. 3 shows a table with triggering errors dependent upon the signal-noise ratio and the frequency of the measurement signal.
FIG. 4 shows a block-circuit diagram of the device according to the invention for digital triggering of a recording of a measurement signal having a superimposed noise signal.
FIGS. 5A, 5B show tables with triggering errors dependent upon the frequency of the measurement signal in the case of the device for digital triggering according to the prior art and in the case of a device for digital triggering according to the invention.

While the table in FIG. 5A presents the triggering errors of a device for digital triggering according to the prior art without a low-pass filter for different frequencies of the measurement signal, the table in FIG. 5B shows the triggering errors of the device according to the invention for digital triggering for different frequencies of the measurement signal. It is clearly evident that the triggering error is reduced over a wide frequency range of the measurement signal with the device according to the invention for digital triggering by comparison with a device for digital triggering according to the prior art.

Figure 6:
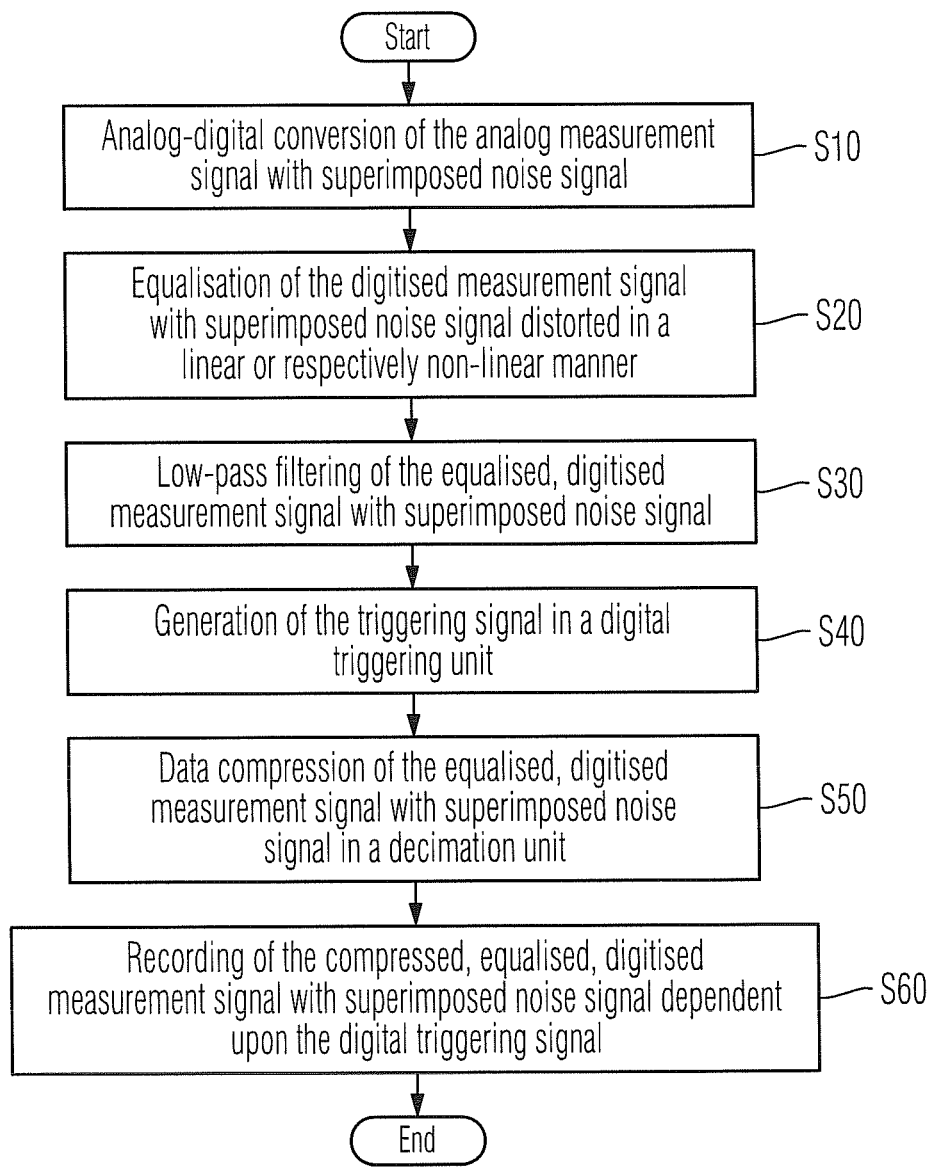
FIG. 6 shows a flow chart of the method according to the invention for digital triggering of a recording of a measurement signal having a superimposed noise signal.

The method for digital triggering according to the invention is illustrated in FIG. 6.

In a first procedural stage S10, the analog measurement signal with superimposed noise signal is converted in an analog/digital converter 1 into its corresponding digital data format.

In the next procedural stage S20, an equalization of the digitized measurement signal, which may be distorted in a linear or respectively non-linear manner with a superimposed noise signal, is implemented.

In the subsequent procedural stage S30, the digitized, equalized measurement signal with superimposed noise signal is filtered in a low-pass filter.

In procedural stage S40 the triggering signal is generated by threshold-value comparison of the low-pass-filtered, equalized, digitized measurement signal having the superimposed noise signal with reference to a threshold value predetermined in a digital triggering unit.

The equalized, digitized measurement signal with superimposed noise signal is compressed in the next procedural stage S50 in a decimation unit by processing further only every n-$^{th}$ sampled value of the equalized, digitized measurement signal with superimposed noise signal.

Finally, in the concluding procedural stage S60, the recording of the compressed, equalized, digitized measurement signal with superimposed noise signal is implemented dependent upon the digital triggering signal. For this purpose, the measurement signal with superimposed noise signal, which is buffered, for example, in the ring buffer 10, is selected dependent upon the triggering signal with regard to its digitized signal components to be stored in a subsequent acquisition memory 8 and displayed on a subsequent visualization unit 9.

The invention is not restricted to the exemplary embodiment presented. In particular, instead of a low-pass filtering, a band-pass filtering with the effect of reducing the bandwidth of the measurement signal having a superimposed noise signal can also be used.

The invention claimed is:

1. A device for digital triggering of a recording of a digitized measurement signal having a superimposed noise signal comprising:
    an analog/digital converter configured to convert an analog measurement signal with a superimposed noise signal to the digitized measurement signal having the superimposed noise signal, the digitized measurement signal being distorted in a linear or non-linear manner;
    a filter-type equalizer directly connected to the analog/digital converter for equalizing the digitized measurement signal;
    a decimation unit directly connected to an output of the filter-type equalizer and configured to compress the output of the filter-type equalizer;
    a digital recording unit directly connected to an output of the decimation unit, wherein the decimation unit compresses the output of the filter-type equalizer by re-routing to the digital recording unit only every n$^{th}$ sampled value of the output of the filter-type equalizer, where n is 2 or more;
    a low-pass filter also directly connected to the output of the filter-type equalizer and configured to band limit the noise signal superimposed on the measurement signal; and
    a digital triggering unit directly connected to the low-pass filter and having an output directly connected to the digital recording unit, the digital triggering unit being configured to receive the measurement signal having the band-limited superimposed noise signal and to trigger the recording of the measurement signal in the recording unit;

wherein the digital recording unit comprises a recording-control unit, an acquisition memory, and a display, wherein the recording-control unit is directly connected to the decimation unit and the digital triggering unit, the acquisition memory is directly connected to the recording-control unit, and the display is directly connected to the acquisition memory, wherein the recording-control unit comprises a ring buffer configured to buffer the compressed sampled values of the measurement signal with superimposed noise in a cyclical manner, and wherein the bandwidth of the low-pass filter is adjusted dependent upon edge steepness of the measurement signal.

2. A method for digital triggering of a digital recording of a digitized measurement signal having a superimposed noise signal, said method comprising:

converting via an analog/digital converter an analog measurement signal with a superimposed noise signal to the digitized measurement signal having the superimposed noise signal, the digitized measurement signal being distorted in a linear or non-linear manner;

equalizing the digitized measuring signal via a filter-type equalizer directly connected to the analog/digital converter;

compressing an output of the filter-type equalizer via a decimation unit directly connected to the output of the filter-type equalizer;

recording the measurement signal via a digital recording unit directly connected to an output of the decimation unit, wherein the decimation unit compresses the output of the filter-type equalizer by re-routing to the digital recording unit only every $n^{th}$ sampled value of the output of the filter-type equalizer, where n is 2 or more band limiting the noise signal superimposed on the measurement signal via a low-pass filter also directly connected to the output of the filter-type equalizer; and receiving the measurement signal having the band-limited superimposed noise signal and trigger the recording of the measurement signal in the recording unit via a digital triggering unit directly connected to the low-pass filter and having an output directly connected to the digital recording unit, wherein the digital recording unit comprises a recording-control unit, an acquisition memory, and a display, wherein the recording-control unit is directly connected to the decimation unit and the digital triggering unit, the acquisition memory is directly connected to the recording-control unit, and the display is directly connected to the acquisition memory, and wherein the recording-control unit comprises a ring buffer configured to buffer the compressed sampled values of the measurement signal with superimposed noise in a cyclical manner, and wherein the bandwidth of the low-pass filter is adjusted dependent upon edge steepness of the measurement signal.

\* \* \* \* \*